United States Patent [19]

Idesawa

[11] Patent Number: 4,961,096
[45] Date of Patent: Oct. 2, 1990

[54] SEMICONDUCTOR IMAGE POSITION SENSITIVE DEVICE WITH PRIMARY AND INTERMEDIATE ELECTRODES

[75] Inventor: Masanori Idesawa, Wako, Japan

[73] Assignee: Rikagaku Kenkyusho, Saitama, Japan

[21] Appl. No.: 320,305

[22] PCT Filed: Jul. 1, 1988

[86] PCT No.: PCT/JP88/00662

§ 371 Date: Feb. 27, 1989

§ 102(e) Date: Feb. 27, 1989

[30] Foreign Application Priority Data

Jul. 2, 1987 [JP] Japan ................. 62-165969

[51] Int. Cl.$^5$ ............................................. H01L 27/14
[52] U.S. Cl. ........................................ 357/30; 357/32; 357/68; 357/51
[58] Field of Search ............... 357/30 D, 30 G, 30 H, 357/30 Q, 30 R, 30 S, 32, 68, 51, 65

[56] References Cited

FOREIGN PATENT DOCUMENTS

| | | | |
|---|---|---|---|
| 57-14704 | 1/1982 | Japan . | |
| 58-137247 | 8/1983 | Japan | 357/30 H |
| 58-151507 | 9/1983 | Japan . | |
| 58-166762 | 10/1983 | Japan | 357/30 D |
| 59-56778 | 4/1984 | Japan . | |
| 62-123784 | 6/1987 | Japan | 357/30 D |

OTHER PUBLICATIONS

Peterson et al., "Position-Sensitive Light Detectors with High Linearity," *IEEE Jour. of Solid-State Circuits*, vol. SC-3, No. 3, Jun. 1978, pp. 393-399.
Noorlag et al., "Two-Dimensional Position-Sensitive Photodetector with High Linearity Made with Standard I.C.-Technology," *Solid-State and Electron Devices*, May 1979, vol. 3, No. 3, May 1979, pp. 75-82.
Noorlag et al., "Quantitative Analysis of Effects Causing Nonlinear Position-Sensitive Photodetectors", *IEEE Transactions on Electronics Devices*, vol. ED-29, No. 1, Jan. 1982.
Wang et al., "The Linearity and Sensitivity of Lateral Effect Position Sensitive Devices—An Improved Geometry," *IEEE Transactions on Electron Devices*, vol. 36, No. 11, Nov. 1989, pp. 2475-2480.

*Primary Examiner*—William Mintel
*Attorney, Agent, or Firm*—Brumbaugh, Graves, Donohue & Raymond

[57] ABSTRACT

In a semiconductor image position sensitive device having a photoconductive layer and a resistive layer thereon, an image position sensitive region is divided into a plurality of sections and an output electrode is provided on each boundary between the sections. Firstly, by use of the output electrode flanking a plurality of the sections, an image existing section, which is narrower than the width of the plurality of the sections, is defined. Secondly, an image position within the image existing section is detected by use of the output electrodes flanking the image existing section. And finally, from the position of the previously defined image existing section and the image position within the image existing section, the image position is determined. The resolution of image position sensing can be improved in proportion to the number of the sections.

9 Claims, 4 Drawing Sheets

SEMICONDUCTOR IMAGE POSITION SENSITIVE DEVICE WITH PRIMARY AND INTERMEDIATE ELECTRODES

TECHNICAL FIELD

This invention relates to a semiconductor image position sensitive device for use in optical measurement of distance, position, movement, distortion, etc. and particularly to construction of a semiconductor image position sensitive device which is adequate for high-precision measurement. This invention also relates to a method for improving precision of image position sensing by use of the position sensitive device.

BACKGROUND ART

As image position sensitive devices for use in optical measurement of position, distance, movement, deformation, etc., there have been widely used semiconductor position sensitive devices(PSD) in which a resistive layer is provided on a photo sensitive layer. In the PSD, photo current is generated under a photo image projected on the photo sensitive layer. The photo current is transmitted through the resistive layer to opposite output electrodes. And the photo current is outputted from the opposite output electrodes. The intensities of the output currents are detected and the center of the intensities of the currents is calculated to determine the position of the photo image. The prior arts are disclosed, for examples, in G. P. Petersson and L. E. Lindholm, "Position sensitive light detectors with high linearity", IEEE J. Solid-State Circuits, vol. SC-3, pp. 392-399, 1987, D. J. W. Noorlag and S. Middelhoek, "Two-dimensional position sensitive photodetector with high linearity made with standard IC-technology", IEEE J. Solid State and Electron Dev., vol. 3, pp. 75-82, 1979, and D. J. W. Noorlag "Quantitative Analysis of Effects Causing Nonlinear Position Response in Position-Sensitive Photodetectors", IEEE Trans. Electron Devices, vol. ED-29, No. 1, pp. 158-161, 1982.

FIG. 5 shows a cross-sectional view of a typical prior art semiconductor position sensitive device. When light L is projected on a photo sensitive layer P, photo current is generated in the photo sensitive layer P. After passing through a resistive layer R, output currents $I_A$ and $I_B$ are outputted from the output electrodes $T_A$ and $T_B$. Values of the output currents $I_A$ and $I_B$ are obtained by dividing the amount of the photo current in the resistance ratio of the resistive layer between the light incident position and the output electrodes $T_A$ and $T_B$, respectively. Thus, value obtained by dividing the difference between the output currents $(I_A-I_B)$ with the sum of the output currents $(I_A+I_B)$ is proportional to the light incident position $X_D$ from the center. Accordingly, we can obtain information about the light incident position by introducing the output currents $I_A$ and $I_B$ into a signal processing circuit as shown in FIG. 6. In the circuit, the output currents are amplified by buffer amplifiers $B_1$ and $B_2$. Next, the above operation is carried out by operational amplifiers $A_1$ and $A_2$ and a divider $\div$, and further, analog to digital conversion is carried out by an analog to digital converter A/D.

The precision of the prior art image position sensing method mainly depends on the precision of the analog signal processing means and the precision (resolution) of the analog to digital conversion. Improvement of the precision of the analog processing means has been almost impossible and even if it is realized it would be very expensive. This creates a big problem for improving the precision (resolution) of image position sensing by use of the semiconductor image sensing device.

DISCLOSURE OF THE INVENTION

In order to solve the above problem, that is, in order to realize high-precise image position sensing without improving precision (resolution) of the analog processing means and that of the analog to digital converter, in this invention, the sensing region of the semiconductor image position sensitive device is divided into a plurality of sections so that an arbitrary section or arbitrary successive sections can be operated as a sole semiconductor image position sensitive device as a result of selection of output electrodes provided on each boundary between the sections. Thus, the output electrodes adequate for measurement are selectively used.

In operation, first, the output electrodes flanking a plurality of the sections are selected. By activating the selected sections as a sole or separate semiconductor image position sensitive device, it is determined which section the light image belongs or exists in. Next, the output electrodes flanking the light image existing section (the output electrodes flanking a plurality of sections if the light image spreads over the plurality of the sections) are selected to detect the position of the light image within the selected section. The position of the light image is obtained by adding the position of the electrode on the selected section to the detected position of the light image within the selected section. Since the positions of the output electrodes on the boundaries of the sections can be precisely settled through manufacturing processes, the precision of the image position sensing depends on only the precision of the image position sensing within the selected section. Since the resolution of the image position sensing within a selected section is almost equal to the precision (resolution) that is determined by an analog processing system and, an A/D converter, an effective resolution over all sections of the semiconductor image position sensitive device is increased in proportion to the number of the sections. Therefore, the precision (resolution) of the image position sensing is significantly increased as compared with the prior art even if the same analog processing system and the A/D converter as in the prior arts are used.

BEST MODE FOR CARRYING OUT THE INVENTION

Figure 1:
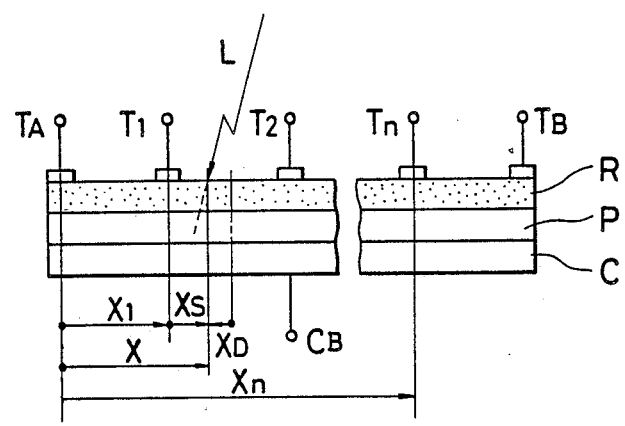
FIG. 1 is a cross-sectional view of a semiconductor image position sensitive device according to this invention.

We will explain this invention referring to examples. FIG. 1 shows a lateral cross section of a semiconductor image sensitive device based on this invention. N output electrodes ($T_1$, $T_2$ ..., $T_n$) are further provided between the output electrodes $T_A$ and $T_B$ of the prior art semiconductor image sensitive device. Assuming that precision of image position sensing is restricted by precision (resolution) of A/D conversion, we will explain how the precision of the image position sensing can be improved by this invention, for example, when light is projected between the output electrodes $T_1$ and $T_2$ on to photosensitive layer P as shown in FIG. 1 and the generated current passes through resistive layer R. In a similar way as in the prior art, the output electrodes $T_A$ and $T_B$ are selected and the light incident position X is obtained, by use of the output currents from the output electrodes. The precision of the light incident position now obtained is the divided value of the length between the output electrodes $T_A$ and $T_B$ with the resolution of the A/D converter. With this precision, the section including the light incident position is determined. Next, the output electrodes ($T_1$ and $T_2$ in FIG. 1) flanking the section including the light incident position are selected. From the output currents from the selected electrodes, a light incident position $X_D$ within the selected section is obtained. The precision of the light incident position $X_S$ is determined by the divided value of the length of the selected section (between $T_1$ and $T_2$) with the resolution of the A/D converter. By adding $X_S$ to the position $X_1$ of the output electrode $T_1$ (or generally $X_n$ for output electrode $T_n$), the total or composite light incident position X is determined. The positions of the output electrodes can be extremely precisely settled and the stability of the position is extremely high. Therefore, concerning all selected sections, it becomes possible to detect the light incident position with the precision which is obtained by dividing the length of each section with the resolution of the A/D converter. For example, if n(15) output electrodes are provided at equal intervals and the resolution of the A/D converter is m(10) bits, the resolution over the entire sensitive region is $(n+1)\times 2^m$ ($16\times 1,024$). Thus, without improving the resolution of the A/D converter, the resolution becomes $(n+1)\times 16$ times higher than that of the conventional method with resolution of $2^m$(1,024). When the light incident position is on the boundary of the sections and light is projected over the two adjacent sections, the two successive sections are selected. In this case, the resolution reduces to $(n+1)/2$, that is, half of the normal condition, but the resolution is significantly improved as compared with the conventional method. The above explanation was made on the basis that the precision of image position sensing depends only upon the resolution of the A/D converter. But a similar explanation will be made for the case that the precision of image position sensing depends upon the precision of the analog signal processing.

Figure 2:
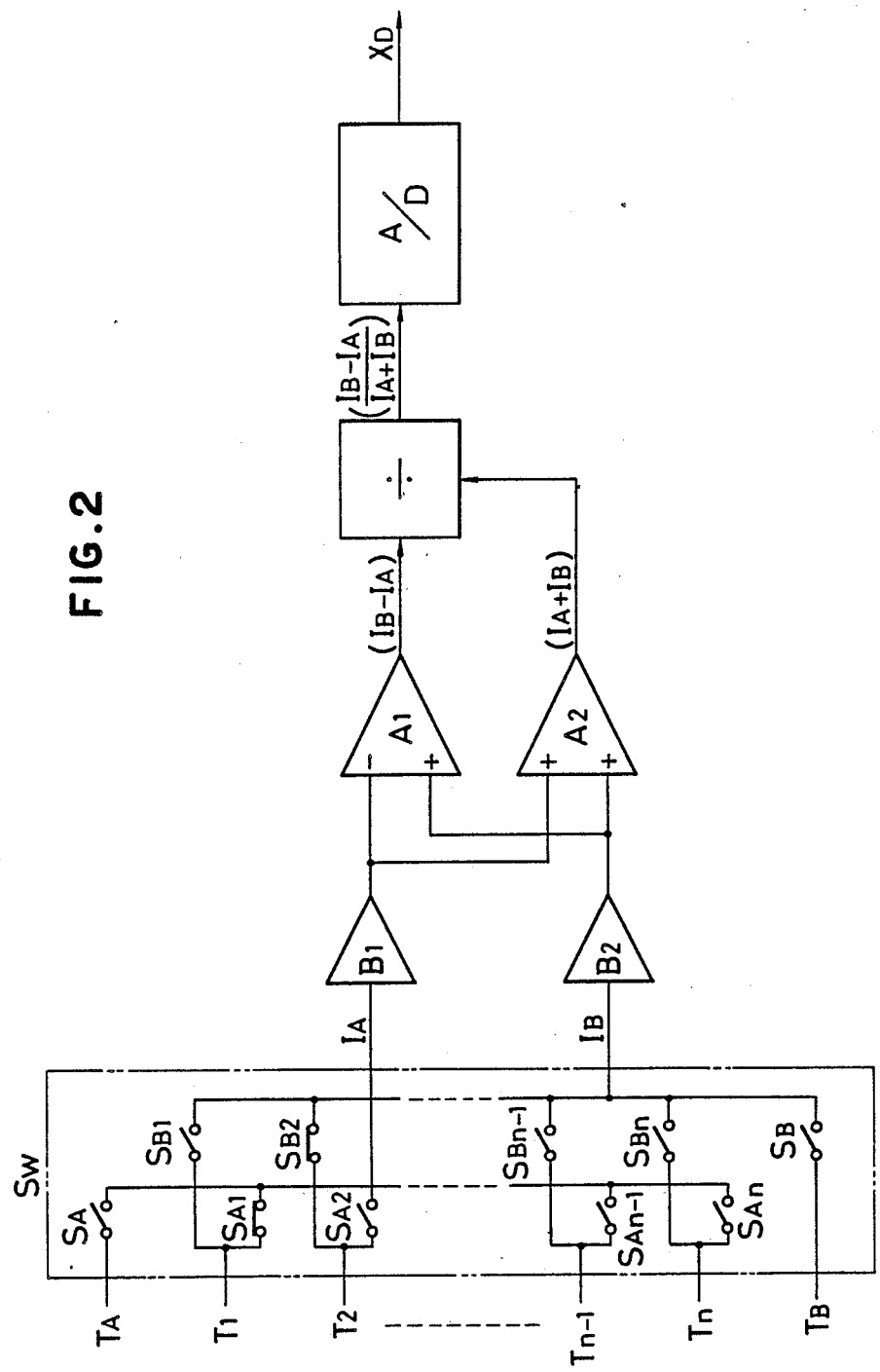
FIG. 2 is a block diagram of a signal processing circuit for driving a semiconductor image position sensitive device of this invention according to a method of this invention.

FIG. 2 shows a block diagram of an output signal processing circuit including switches for selecting output electrodes. Any two electrodes among the output electrodes are selected by electrode selection switches $S_A$, $S_{A1}$, $S_{A2}$ ... $S_{An}$, $S_{B1}$, $S_{B2}$ ... $S_{Bn}$ ... $S_B$ to connect with input terminals of buffer amplifiers $B_1$, $B_2$. In FIG. 2, the output electrodes $T_1$ and $T_2$ are selected corresponding to FIG. 1. Since the output currents are outputted from the selected electrodes between which is the light incident position, the switches $S_A$ and $S_B$ corresponding to the output electrodes $T_A$ and $T_B$ on the opposite ends may be left as the closed state. In FIG. 2, the switches (circuit $S_w$) for selecting the output electrodes are shown as an external circuit, but it is preferable to integrate the semiconductor image position sensitive device with the analog switch circuit and to take the output signals out of the output electrodes of the desired section by use of a selection signal fed from the outside.

Figure 3:
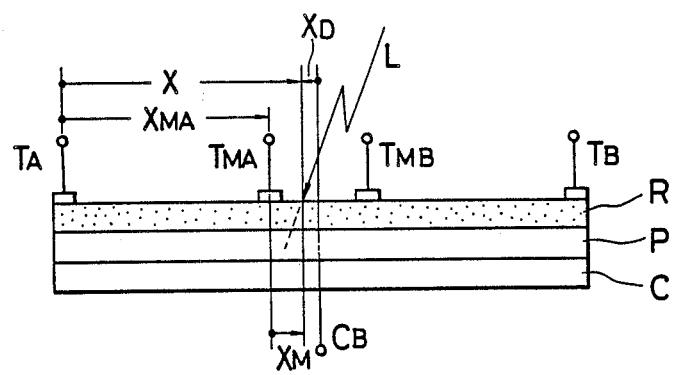
FIG. 3 is a sectional view of another example of a semiconductor image position sensitive device according to this invention.

FIG. 3 shows a lateral cross section of a semiconductor image position sensitive device according to this invention in which image position sensing is available over a wide range. Output electrodes $T_{MA}$, $T_{MB}$ are selected when light is projected on the predetermined region (the target section: the section between the output electrodes $T_{MA}$ and $T_{MB}$), thereby detecting the image position with high precision. First, by selecting the output electrodes $T_A$ and $T_B$, it is detected whether the light incident position is in the target section or not. When the light incident position $X_D$ is within the target section, the output electrodes $T_{MA}$ and $T_{MB}$ are selected to detect a light incident position $X_M$ within the target section. The light incident position X over the entire region can be obtained by adding the position $X_{MA}$ of $T_{MA}$ to the light incident position $X_M$ within the target section.

Figure 4:
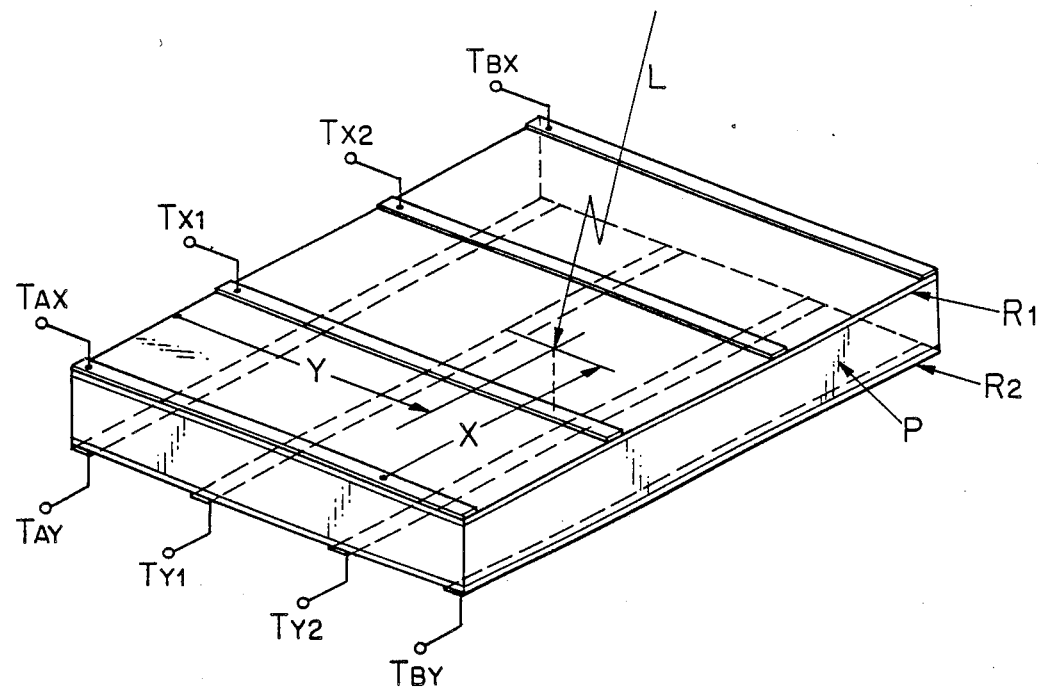
FIG. 4 is a perspective view of a two-dimensional image sensitive device according to this invention.
Figure 5:
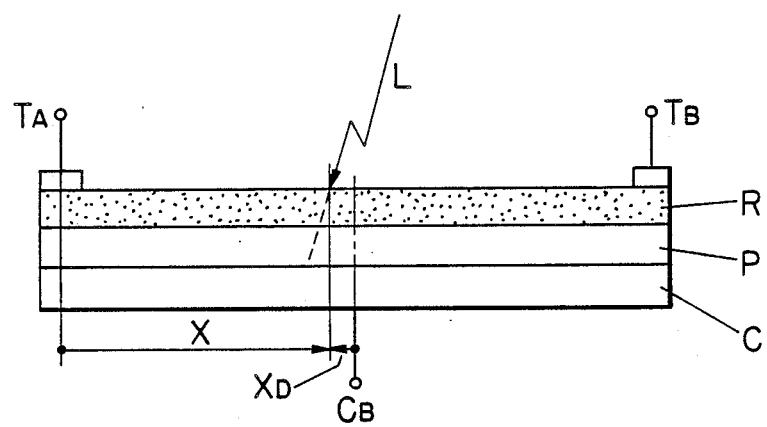
FIG. 5 is a sectional view of a prior art typical semiconductor image position sensitive device (PSD)
Figure 6:
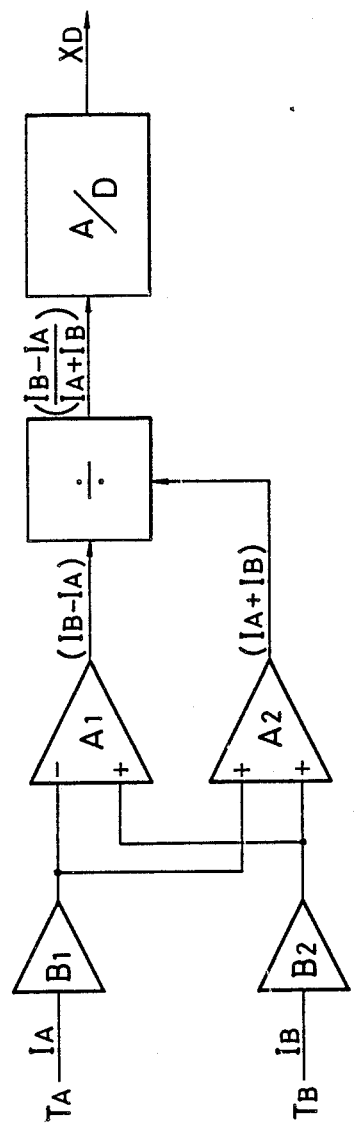
FIG. 6 is a block diagram of a signal processing circuit for sensing an image position by a prior art PSD.

FIG. 4 is an example of a two dimensional image position sensitive device according to this invention, in which resistive layers $R_1$ and $R_2$ are provided onto an upper surface and a lower surface, the resistive layer $R_1$ of the upper surface is used for sensing the image position in the X-direction and the resistive layer $R_2$ of the lower surface is used for sensing the image position in the Y-direction. In this example, each surface is divided into three sections, but it is possible to divide it into an arbitrary number of sections. In order to sense an image position, the selections of the output electrodes $T_{AX}$, $T_{X1}$, $T_{X2}$ and $T_{BX}$ for the X-direction and the output electrodes $T_{AY}$, $T_{Y1}$, $T_{Y2}$ and $T_{BY}$ for the Y-direction are carried out as described above. If this invention is applied to a two dimensional image position sensitive device in which a resistive layer is disposed on only one surface, these output electrodes should be isolated at the crossings because the output electrodes for X-direction and Y-direction are overlapped. As described above, according to this invention, it is possible to increase the resolution of image position sensing in proportion to the number of the sections while the accuracy of the power supply and the precision of the signal processing circuit and the A/D converter are unchanged. Therefore, it is possible to detect an image position with high-precision over a wide region that has been impractical for the conventional semiconductor image position sensitive devices.

As many apparently widely different embodiments of this invention may be made without departing from the spirit and the scope thereof, it is to be understood that the invention is not limited to the specific embodiments thereof except as defined in the appended claims.

I claim:
1. An image position sensitive device, comprising:
   photosensitive means, having a surface on which an image may be projected, for generating a photocurrent in response to the image and for conducting said current subject to a resistance characteristic;

a plurality of primary electrode means, bounding an image sensitive region of said photosensitive means, for coupling image representation currents; and at least one intermediate electrode means, coupled to said photosensitive means intermediate said primary electrode means, for coupling image representative currents;

whereby said image sensitive region is sectioned by said intermediate electrode means so that image position may be roughly determined by ratio evaluations based on image currents coupled by the primary electrode means and more accurately determined by ratio evaluations using image currents coupled by intermediate electrode means.

2. An image position sensitive device according to claim 1, wherein said plurality of primary electrode means comprises two parallel electrodes bounding said image sensitive region near edges of said region and said intermediate electrode means comprises at least one electrode substantially parallel to said primary electrodes positioned so as to divide said image sensitive region into a plurality of sections of substantially equal size.

3. An image position sensitive device according to claim 1, wherein said photosensitive means comprises a continuous photosensitive layer and a resistive layer for coupling said image representative currents and said electrode means are coupled to said resistive layer.

4. An image position sensitive device according to claim 3, further comprising a second resistive layer disposed on the side of the photosensitive layer opposite said resistive layer, and second primary and intermediate electrode means coupled to said second resistive layer in crossing relation to the primary and intermediate electrode means, wherein the image currents coupled by said primary and intermediate electrode means may determine the image position in a first dimension and second image currents coupled by said second primary and intermediate electrode means may determine the image position in a second dimension.

5. An image position sensitive device according to claim 1, further comprising means for performing current ratio evaluations.

6. An image position sensitive device according to claim 1, further comprising switching means for activating desired pairs of said electrodes for successive rough and more accurate image position determinations.

7. An image position sensitivity device according to claim 6 further comprising means for determining whether the image is projected over at least two sections and if it is, signaling said switching to activate means the pair of electrodes bounding said at least two sections.

8. An image position sensitive system, comprising:
photosensitive means, having a surface on which an image may be projected, for generating a photocurrent in response to the image and for conducting said current subject to a resistance characteristic;

a plurality of primary electrode means, bounding an image sensitive region of said photosensitive means, for coupling image representative currents;

at least one intermediate electrode means, coupled to said photosensitive means intermediate said primary electrode means, for coupling image representative currents; and means for measuring the image currents flowing through the primary electrodes, determining which pair of electrodes most closely bound the image position, selecting said pair of electrodes, and measuring the image currents flowing from said pair of electrodes;

whereby the position of the image is roughly determinable from the measured primary electrode image current and the position of the image is more accurately determinable from the intermediate electrode image currents.

9. A method for determining the position of an image on a photosensitive region coupled to primary and intermediate electrode means, comprising the steps of:
generating a photocurrent from the position of an image;
measuring the photocurrent flowing through the primary electrodes;
determining which pair of two electrodes most clearly bound the image position;
selecting the bounding pair of electrodes;
measuring the photocurrent flowing through the bounding pair of electrodes;
determining from the photocurrent the position of the image between the bounding pair of electrodes; and
combining said position determination with position information regarding the location of said bounding pair of electrodes to determine the overall position of the image.

* * * * *

UNITED STATES PATENT AND TRADEMARK OFFICE
CERTIFICATE OF CORRECTION

PATENT NO. : 4,961,096

DATED : October 2, 1990

INVENTOR(S) : Masanori Idesawa

It is certified that error appears in the above-identified patent and that said Letters Patent is hereby corrected as shown below:

Title page, 2nd Column, 5th line, after "Nonlinear" insert --Position Response in--;

Title page, 2nd Column, 6th line, "Electronics" should read --Electron--;

Title page, 2nd Column, 6th line of ABSTRACT, "electrode" should read --electrodes--;

Column 3, line 4, "We" should read --I--;

Column 3, line 11, "we" should read --I--;

Column 6, line 4, after "switching" insert --means--;

Column 6, line 5, delete "means".

Signed and Sealed this

Thirtieth Day of June, 1992

Attest:

DOUGLAS B. COMER

Attesting Officer

Acting Commissioner of Patents and Trademarks